US012812796B2

(12) United States Patent
Lu

(10) Patent No.: US 12,812,796 B2
(45) Date of Patent: Nov. 24, 2026

(54) PORTABLE ELECTRONIC DEVICE HAVING THROUGH SLOTS AND PORTABLE ELECTRONIC DEVICE ASSEMBLY HAVING THE SAME

(71) Applicant: Getac Technology Corporation, New Taipei (TW)

(72) Inventor: Weisen Lu, Taipei (TW)

(73) Assignee: Getac Technology Corporation, New Taipei (TW)

( * ) Notice: Subject to any disclaimer, the term of this patent is extended or adjusted under 35 U.S.C. 154(b) by 65 days.

(21) Appl. No.: 19/020,685

(22) Filed: Jan. 14, 2025

(65) Prior Publication Data

US 2025/0311119 A1 Oct. 2, 2025

(30) Foreign Application Priority Data

Apr. 2, 2024 (CN) ........................ 202410391581.X

(51) Int. Cl.

*H05K 5/00* (2025.01)
*A45F 5/00* (2006.01)
*H05K 5/02* (2006.01)

(52) U.S. Cl.

CPC ......... *H05K 5/0086* (2013.01); *A45F 5/1516* (2025.01); *H05K 5/0217* (2013.01)

(58) Field of Classification Search

CPC .. H05K 5/0217; H05K 5/0086; A45F 5/1525; A45F 5/1516

See application file for complete search history.

(56) References Cited

U.S. PATENT DOCUMENTS 6,655,540 B2 * 12/2003 Shimoda ................. G06F 1/163
455/575.1

FOREIGN PATENT DOCUMENTS

| | | |
|---|---|---|
| CN | 1322108 A | 11/2001 |
| CN | 212546001 | 2/2021 |
| CN | 218783819 U | 3/2023 |
| TW | 201210438 A | 3/2012 |

OTHER PUBLICATIONS

Taiwan Patent Office, "Office Action", Jan. 20, 2025, Taiwan.

* cited by examiner

*Primary Examiner* — James Wu

(74) *Attorney, Agent, or Firm* — Troutman Pepper Locke LLP; Tim Tingkang Xia, Esq.

(57) ABSTRACT

A portable electronic device configured for a strap body to be disposed. The portable electronic device includes a main body and at least one inner body. At least one corner of the main body includes two outer portions. An accommodation space is formed between the two outer portions. Each of the two outer portions has an outer through hole. The at least one inner body is disposed in the accommodation space, and is located between the two outer portions. The at least one inner body has an inner through hole. The two outer through holes and the inner through hole are connected to one another to form a through slot. The through slot is configured for the strap body to be disposed therethrough.

12 Claims, 7 Drawing Sheets

PORTABLE ELECTRONIC DEVICE HAVING THROUGH SLOTS AND PORTABLE ELECTRONIC DEVICE ASSEMBLY HAVING THE SAME

CROSS-REFERENCE TO RELATED APPLICATIONS

This non-provisional application claims priority under 35 U.S.C. § 119 (a) on Patent Application No(s). 202410391581.X filed in China, on Apr. 2, 2024, the entire contents of which are hereby incorporated by reference.

TECHNICAL FIELD

The disclosure relates to a portable electronic device and a portable electronic device assembly, more particularly to a portable electronic device and a portable electronic device assembly having through slots.

BACKGROUND

Portable electronic devices such as smartphones, tablet computers or notebook computers, have become indispensable electronic products in daily life since the electronic devices are easy to carry so that users can do various tasks via the electronic devices anytime and anywhere.

Generally, straps are provided on the portable electronic devices, so that the portable electronic devices can be easily held by the users. However, the straps are usually disposed on mounting structures located at the back of the portable electronic devices, so that the portable electronic devices cannot be placed firmly. In addition, the mounting structures are fixed on the portable electronic devices, which causes the inconvenience of the maintenance and the replacement of the straps. Therefore, how to improve the convenience of the maintenance and the replacement of the straps is one of the problems required to be addressed.

SUMMARY

The disclosure provides a portable electronic device and a portable electronic device assembly which enable a strap body to be maintained or replaced conveniently.

One embodiment of the disclosure provides a portable electronic device configured for a strap body to be disposed. The portable electronic device includes a main body and at least one inner body. At least one corner of the main body includes two outer portions. An accommodation space is formed between the two outer portions. Each of the two outer portions has an outer through hole. The at least one inner body is disposed in the accommodation space, and is located between the two outer portions. The at least one inner body has an inner through hole. The two outer through holes and the inner through hole are connected to one another to form a through slot. The through slot is configured for the strap body to be disposed therethrough.

Another embodiment of the disclosure provides a portable electronic device assembly including a portable electronic device and a strap body. The portable electronic device includes a main body and at least one inner body. The at least one corner of the main body includes two outer portions. An accommodation space is formed between the two outer portions. Each of the two outer portions has an outer through hole. The at least one inner body is disposed in the accommodation space, and is located between the two outer portions. The at least one inner body has an inner through hole. The two outer through holes and the inner through hole are connected to one another to form a through slot. The strap body includes a holding portion and at least one strap portion. An end of the at least one strap portion is connected to the holding portion. Another end of the at least one strap portion is disposed through the through slot.

According to the portable electronic device and the portable electronic device assembly disclosed by the above embodiments, the at least one inner body is disposed at the at least one corner of the main body, and the outer through holes of the outer portions and the inner through hole of the at least one inner body together form the through slot, so that the strap body is disposed through the through slot located at the at least one corner of the portable electronic device. Accordingly, the portable electronic device assembly can be placed firmly. In addition, the portable electronic device assembly does not require additional mounting structures (e.g., strap rings) for the installation of the strap body, thereby improving the convenience of manufacturing the portable electronic device assembly and installing the strap body on the portable electronic device. In addition, the at least one inner body can be removed from the accommodation spaces for enabling the at least one inner body or the strap body to be maintained or replaced. Accordingly, the convenience of the maintenance and the replacement of the strap body can be further improved.

BRIEF DESCRIPTION OF THE DRAWINGS

The disclosure will become more fully understood from the detailed description given hereinbelow and the accompanying drawings which are given by way of illustration only and thus are not limitative of the disclosure and wherein.

DETAILED DESCRIPTION

Figure 1:
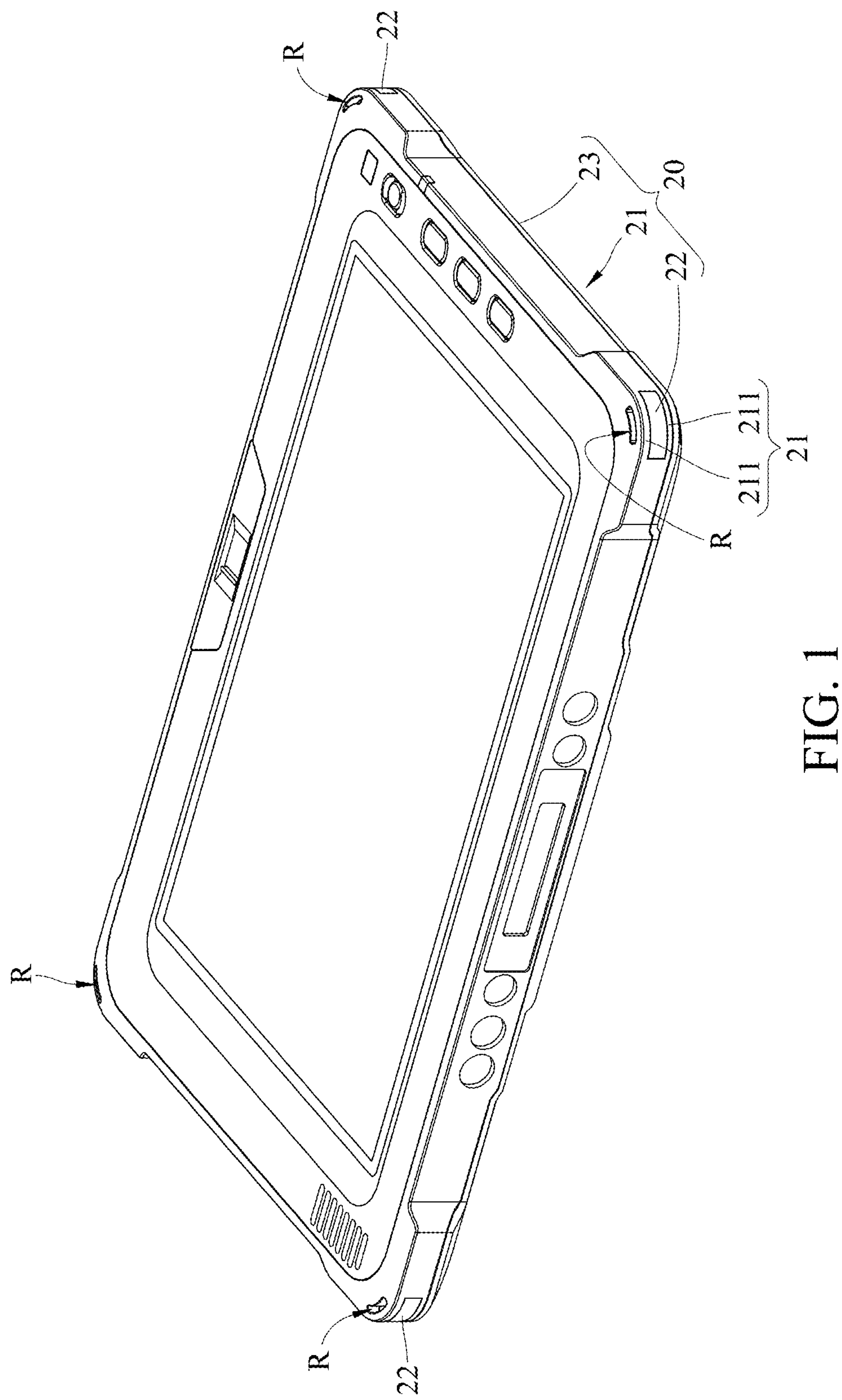
FIG. 1 is a perspective view of a portable electronic device of a portable electronic device assembly in accordance with a first embodiment of the disclosure.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

In addition, the terms used in the disclosure, such as technical and scientific terms, have its own meanings and can be comprehended by those skilled in the art, unless the terms are additionally defined in the disclosure. That is, the terms used in the following paragraphs should be read on the meaning commonly used in the related fields and will not be overly explained, unless the terms have a specific meaning in the disclosure.

Figure 2:
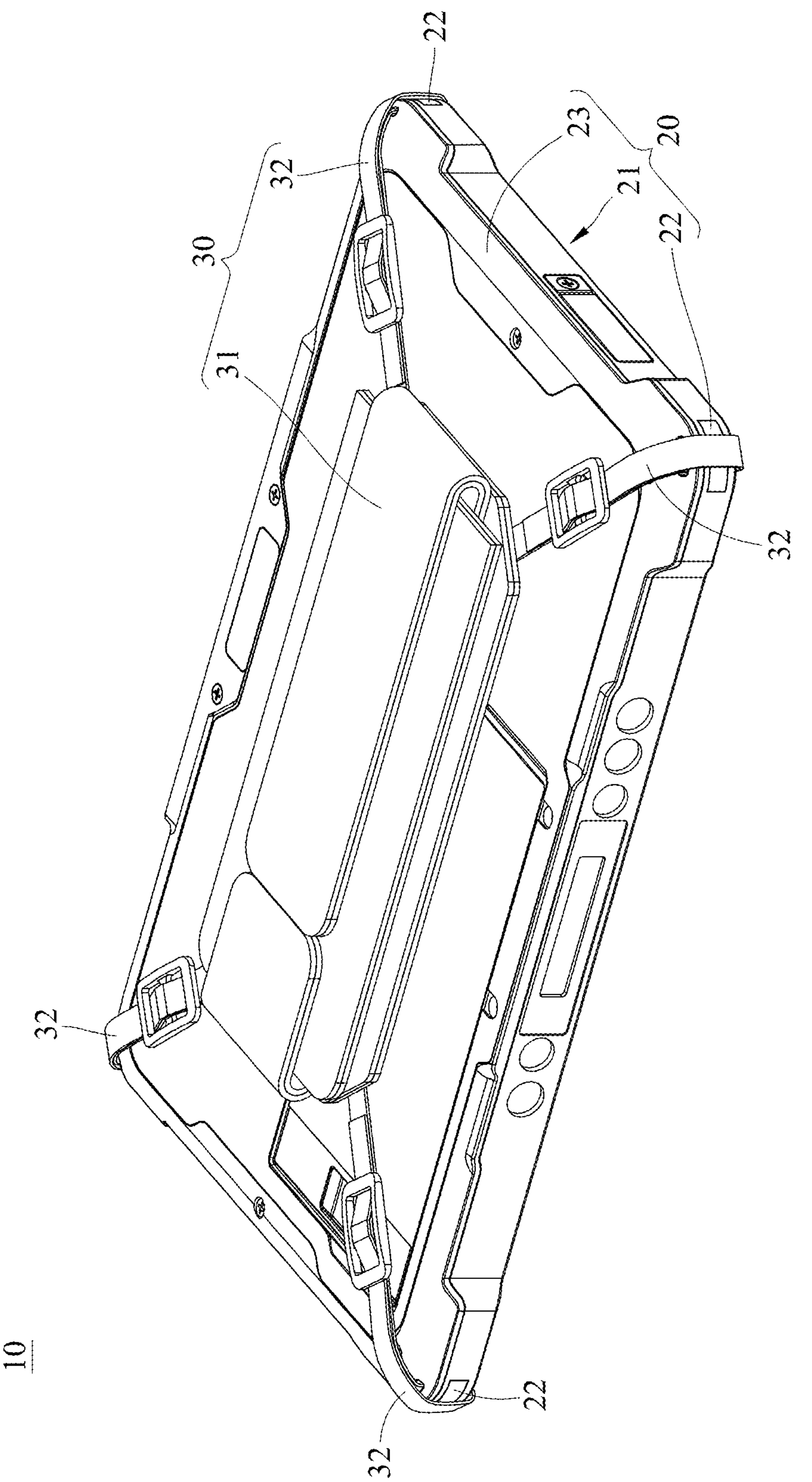
FIG. 2 is another perspective view of the portable electronic device assembly in FIG. 1.
Figure 3:
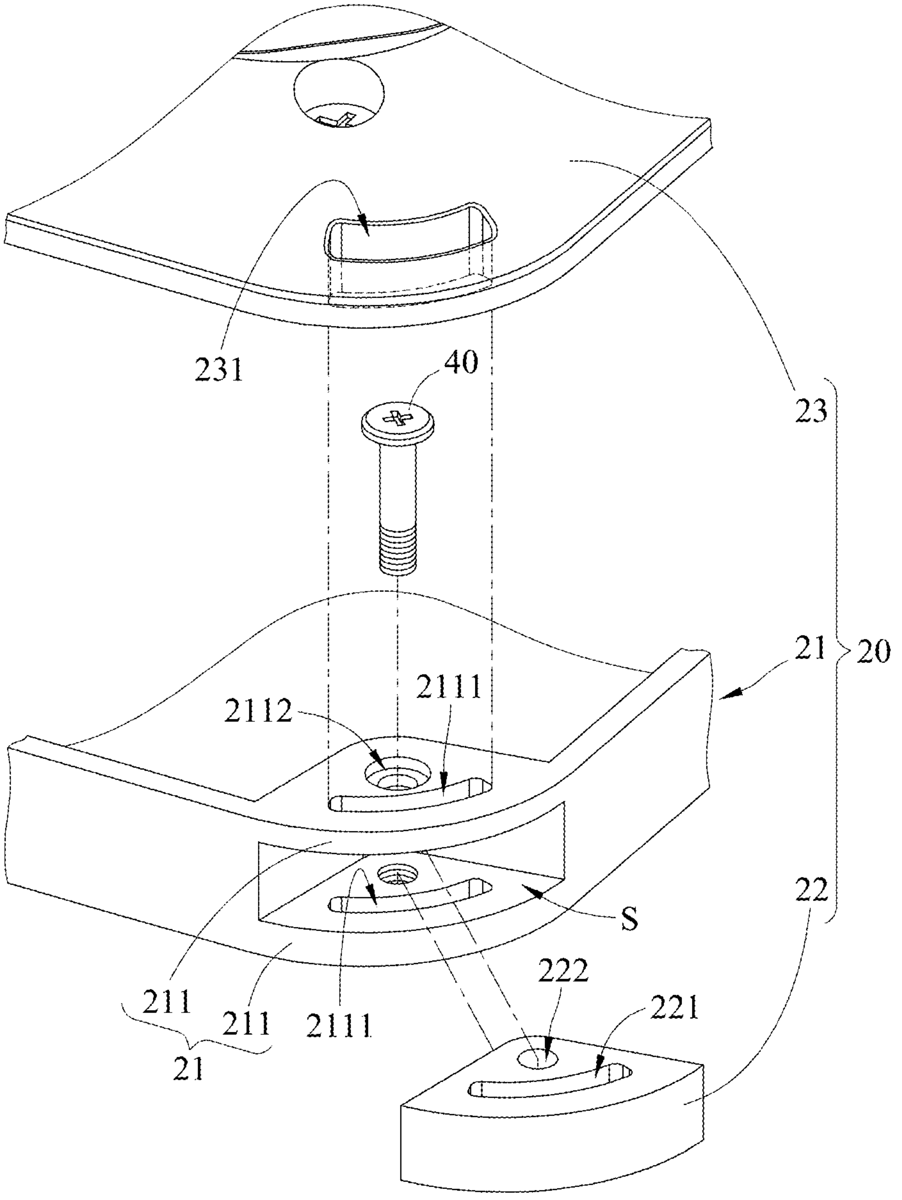
FIG. 3 is a partial exploded view of the portable electronic device assembly in FIG. 1.

Please refer to FIG. 1 to FIG. 3, where FIG. 1 is a perspective view of a portable electronic device 20 of a portable electronic device assembly 10 in accordance with a first embodiment of the disclosure, FIG. 2 is another perspective view of the portable electronic device assembly 10 in FIG. 1, and FIG. 3 is a partial exploded view of the portable electronic device assembly 10 in FIG. 1.

In this embodiment, the portable electronic device assembly 10 includes a portable electronic device 20 and a strap body 30. The portable electronic device 20 includes a main body 21, four inner bodies 22 and a decorative member 23. The main body 21 is, for example, a smart phone or a tablet computer. The decorative member 23 is disposed on a side of the main body 21, and is configured to decorate the main body 21. For example, the decorative member 23 is disposed on the back of the main body 21.

Figure 4:
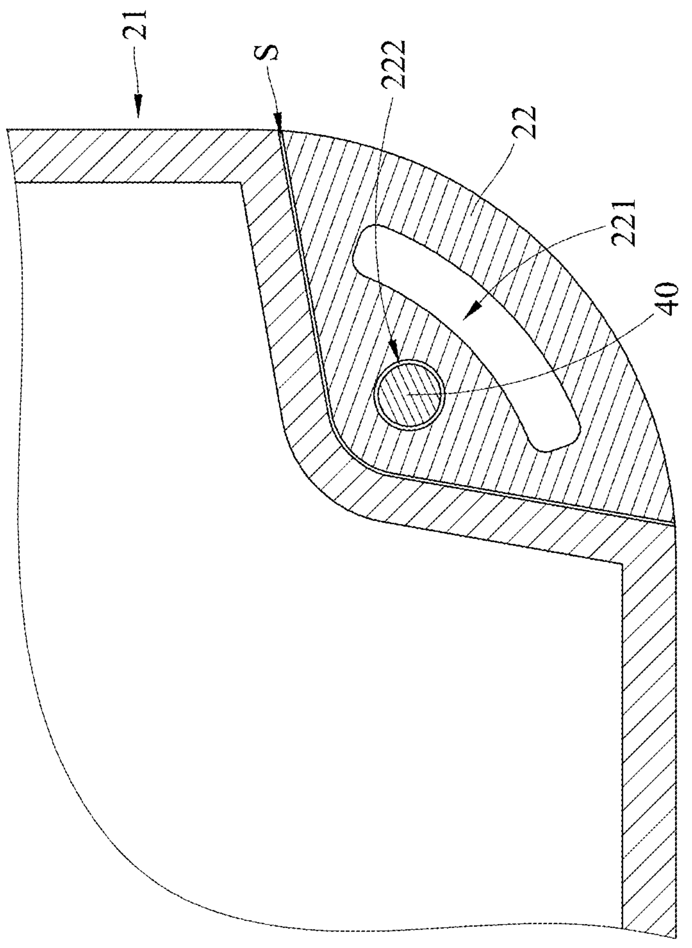
FIG. 4 is a partial cross-sectional view of the portable electronic device assembly in FIG. 1.
Figure 5:
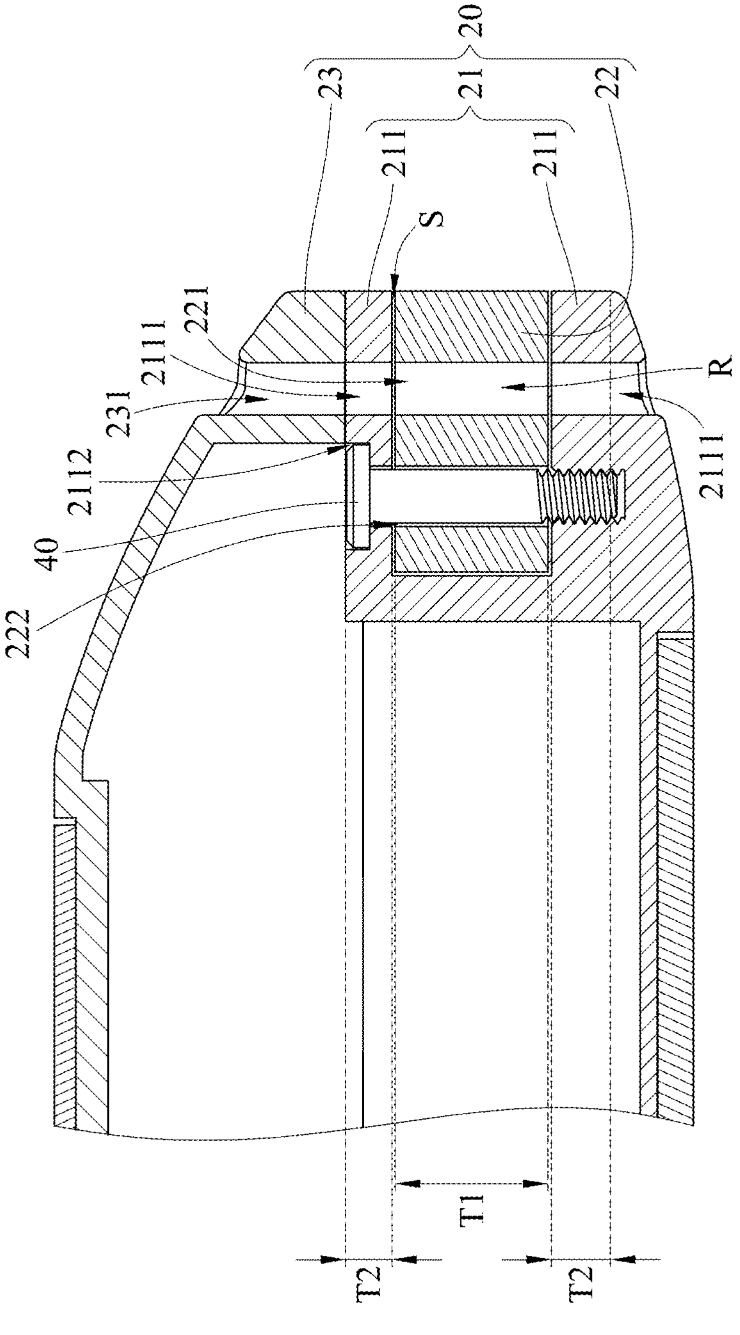
FIG. 5 is another partial cross-sectional view of the portable electronic device assembly in FIG. 1.

Please refer to FIG. 1 to FIG. 5, where FIG. 4 is a partial cross-sectional view of the portable electronic device assembly 10 in FIG. 1, and FIG. 5 is another partial cross-sectional view of the portable electronic device assembly 10 in FIG. 1.

Each of four corners of the main body 21 includes two outer portions 211. An accommodation space S is formed between the two outer portions 211. Each of the two outer portions 211 has a first outer through hole 2111. Each of four corners of the decorative member 23 has a second outer through hole 231. The inner bodies 22 are, for example, protective pads, and are disposed in the accommodation spaces S, respectively. Each of the four inner bodies 22 is located between the two outer portions 211 disposed at one of the four corners of the main body 21, and has an inner through hole 221. The two first outer through holes 2111, the second outer through hole 231 and the inner through hole 221 are connected to each other to form a through slot R. A thickness T1 of each of the inner bodies 22 is, for example, greater than two times of a thickness T2 of one of the outer portions 211. In addition, a hardness of the inner bodies 22 is, for example, greater than a hardness of the main body 21. For example, the inner bodies 22 are made of metal material, and the outer portions 211 are made of plastic material. Accordingly, when the portable electronic device 20, for example, hits the ground, the corners of the main body 21 can be protected by the inner bodies 22 made of metal material, thereby preventing the electronic components inside the main body 21 from being damaged.

The strap body 30 includes a holding portion 31 and four strap portions 32. An end of each of the strap portions 32 is connected to the holding portion 31. Other ends of the strap portions 32 are disposed through the through slots R, respectively. Accordingly, the portable electronic device assembly 10 can be carried more conveniently via the strap body 30.

In this embodiment, the portable electronic device assembly 10 may also include four fasteners 40. Each of the corners of the main body 21 may also have a first fastening hole 2112. Each of the inner bodies 22 may also have a second fastening hole 222. The fasteners 40 are, for example, screws, and the first fastening holes 2112 and the second fastening holes 222 are, for example, screw holes. The first fastening holes 2112 correspond to the second fastening holes 222, respectively. The fasteners 40 are screwed into the first fastening holes 2112 and the second fastening holes 222, so that the inner bodies 22 are fixed to the corners of the main body 21, respectively.

In this embodiment, the inner bodies 22 are disposed at the corners of the main body 21 via the fasteners 40, and the first outer through holes 2111 of the outer portions 211, the second outer through holes 231 of the decorative member 23 and the inner through holes 221 of the inner bodies 22 together form the through slots R, so that the strap body 30 is disposed through the through slots R located at the corners of the portable electronic device 20. Accordingly, the portable electronic device assembly 10 can be placed firmly. In addition, the portable electronic device assembly 10 does not require additional mounting structures (e.g., strap rings) for the installation of the strap body 30, thereby improving the convenience of manufacturing the portable electronic device assembly 10 and installing the strap body 30 on the portable electronic device 20. In the case that the hardness of the inner bodies 22 is, for example, greater than the hardness of the main body 21, the inner bodies 22 can resist a tension force generated when the strap body 30 is held, thereby preventing the corners of the main body 21 from being damaged. In addition, as long as the fasteners 40 are removed, the inner bodies 22 can be removed from the accommodation spaces S for enabling the inner bodies 22 or the strap body 30 to be maintained or replaced. Accordingly, the convenience of the maintenance and the replacement of the strap body 30 can be further improved.

In this embodiment, the portable electronic device 20 includes four inner bodies 22, and the inner bodies 22 are disposed on the corners of the main body 21, respectively, but the disclosure is not limited thereto. In other embodiments, the portable electronic device may include three or less than three inner bodies according to actual requirements.

In this embodiment, the portable electronic device assembly 10 includes one strap body 30, but the disclosure is not limited thereto. In other embodiments, the portable electronic device assembly may include a plurality of strap bodies according to actual requirements.

In this embodiment, the strap body 30 includes four strap portions 32, and the strap portions 32 are disposed through the through slots R, respectively, but the disclosure is not limited thereto. In other embodiments, the strap body may include three or less than three strap portions according to actual requirements, and the strap portion(s) may be optionally disposed through at least one of the through slots.

In this embodiment, the thickness T1 of each of the inner bodies 22 is, for example, greater than two times of the thickness T2 of one of the outer portions 211, but the disclosure is not limited thereto. In other embodiments, the thickness of each of the inner bodies may be not greater than two times of the thickness of one of the outer portions, but only greater than one time of the thickness of one of the outer portions.

In this embodiment, the inner bodies 22 are fixed to the main body 21 via the fasteners 40, but the disclosure is not limited thereto. In other embodiments, the inner bodies may be fixed to the main body via other suitable means.

Figure 6:
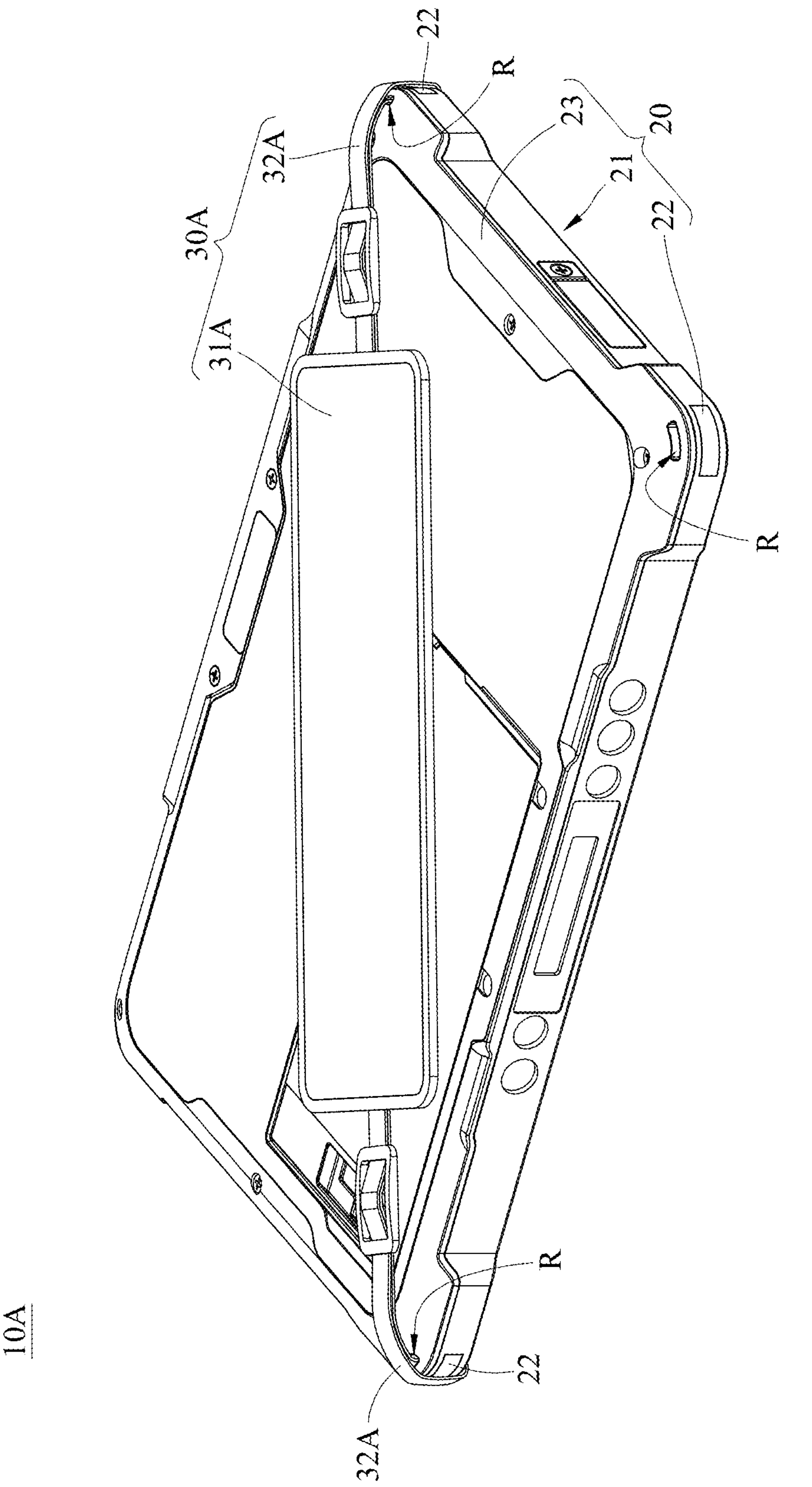
FIG. 6 is a perspective view of a portable electronic device assembly in accordance with a second embodiment of the disclosure.

Please refer to FIG. 6, which is a perspective view of a portable electronic device assembly 10A in accordance with a second embodiment of the disclosure. The portable electronic device assembly 10A of this embodiment is similar to the portable electronic device assembly 10 of the first embodiment, the main difference between them will be described below, and the same parts between them can be referred to the aforementioned paragraphs with the reference to FIG. 1 to FIG. 5 and will not be repeatedly introduced hereinafter.

In this embodiment, a strap body 30A of the portable electronic device assembly 10A includes a holding portion 31A and two strap portions 32A. Ends of the strap portions 32A are disposed through two through slots R located at diagonal two of the four corners of the main body 21, respectively. That is, the strap body 30A can be disposed through the desired through slots R of the portable electronic device 20 according to actual requirements.

Figure 7:
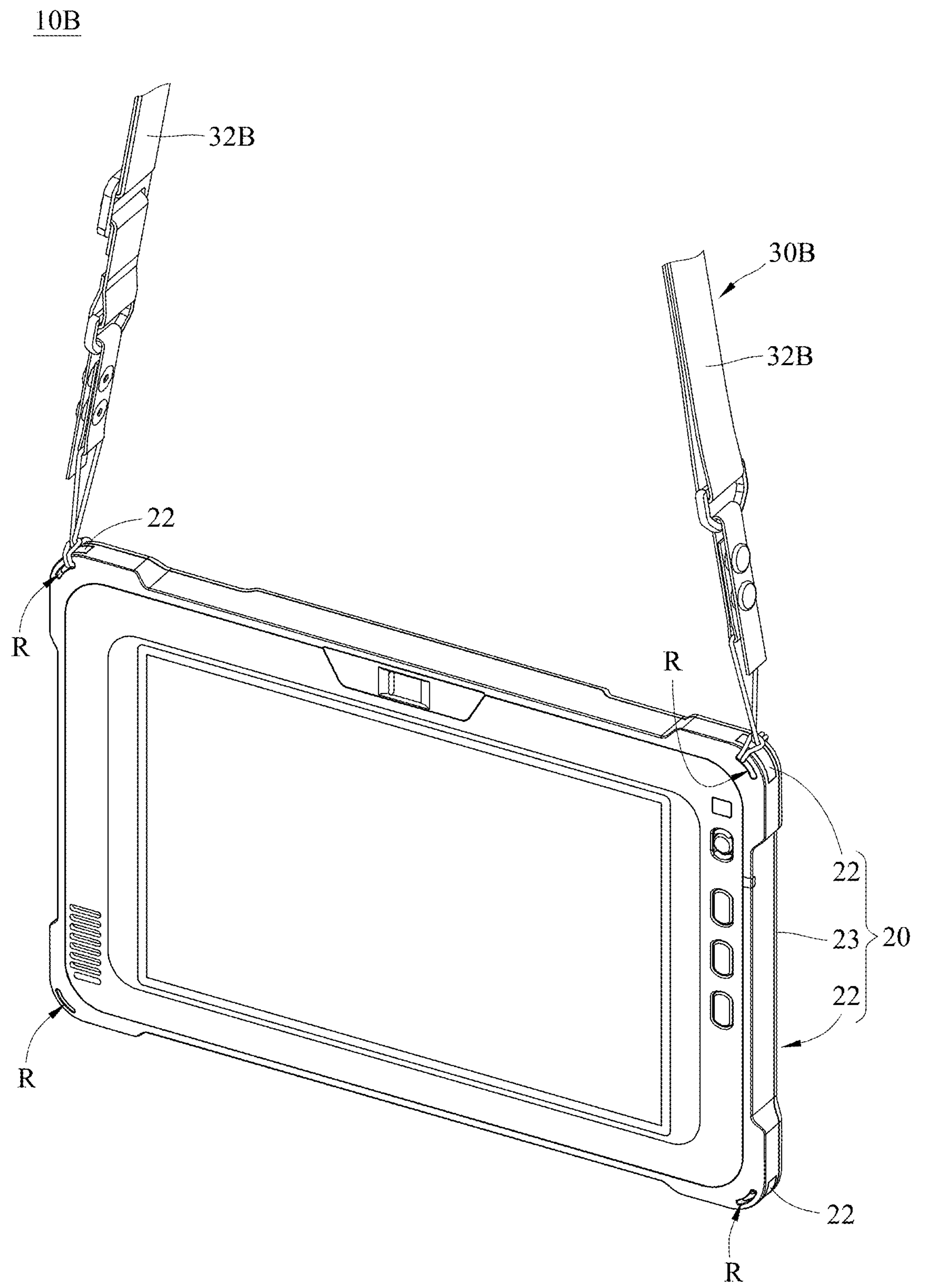
FIG. 7 is a perspective view of a portable electronic device assembly in accordance with a third embodiment of the disclosure.

Please refer to FIG. 7, which is a perspective view of a portable electronic device assembly 10B in accordance with a third embodiment of the disclosure. The portable electronic device assembly 10B of this embodiment is similar to the portable electronic device assembly 10 of the first embodiment, the main difference between them will be described below, and the same parts between them can be referred to the aforementioned paragraphs with the reference to FIG. 1 to FIG. 5 and will not be repeatedly introduced hereinafter.

In this embodiment, a strap body 30B of the portable electronic device assembly 10B includes two strap portions 32B. Ends of the strap portions 32B are disposed through two adjacent through slots R of the main body 21, respectively. That is, the strap body 30B can be disposed through the desired through slots R of the portable electronic device 20 according to actual requirements.

According to the portable electronic device and the portable electronic device assembly disclosed by the above embodiments, the inner bodies are disposed at the corners of the main body via the fasteners, and the first outer through holes of the outer portions, the second outer through holes of the decorative member and the inner through holes of the inner bodies together form the through slots, so that the strap body is disposed through the through slots located at the corners of the portable electronic device. Accordingly, the portable electronic device assembly can be placed firmly. In addition, the portable electronic device assembly does not require additional mounting structures (e.g., strap rings) for the installation of the strap body, thereby improving the convenience of manufacturing the portable electronic device assembly and installing the strap body on the portable electronic device. In the case that the hardness of the inner bodies is, for example, greater than the hardness of the main body, the inner bodies can resist a tension force generated when the strap body is held, thereby preventing the corners of the main body from being damaged. In addition, as long as the fasteners are removed, the inner bodies can be removed from the accommodation spaces for enabling the inner bodies or the strap body to be maintained or replaced. Accordingly, the convenience of the maintenance and the replacement of the strap body can be further improved.

It will be apparent to those skilled in the art that various modifications and variations can be made to the disclosure. It is intended that the specification and examples be considered as exemplary embodiments only, with a scope of the disclosure being indicated by the following claims and their equivalents.

What is claimed is:

1. A portable electronic device, configured for a strap body to be disposed, and the portable electronic device comprising:

a main body defining a thickness direction, wherein at least one corner of the main body comprises two outer portions, an accommodation space is formed between the two outer portions along the thickness direction, and each of the two outer portions has an outer through hole; and at least one inner body, disposed in the accommodation space and located between the two outer portions, wherein the at least one inner body has an inner through hole, the two outer through holes and the inner through hole are connected to one another to form a through slot, and the through slot is configured for the strap body to be disposed therethrough;

wherein the accommodation space between the two outer portions is exposed at the at least one corner of the main body, allowing the at least one inner body to be mounted into the accommodation space along an inward direction or to be retracted from the accommodation space along an outward direction opposite to the inward direction, and wherein the inward direction and the outward direction are perpendicular to the thickness direction.

2. The portable electronic device according to claim 1, comprising at least one fastener, wherein one of the two outer portions of the main body has a first fastening hole, the at least one inner body has a second fastening hole, the first fastening hole corresponds to the second fastening hole, and the at least one fastener is fastened into the first fastening hole and the second fastening hole to fix the at least one inner body to the at least one corner of the main body.

3. The portable electronic device according to claim 1, wherein a thickness of the at least one inner body along the thickness direction is greater than a thickness of one of the two outer portions along the thickness direction.

4. The portable electronic device according to claim 3, wherein the thickness of the at least one inner body along the thickness direction is greater than two times of the thickness of one of the two outer portions along the thickness direction.

5. The portable electronic device according to claim 1, wherein a hardness of the at least one inner body is greater than a hardness of the main body.

6. A portable electronic device assembly, comprising:

a portable electronic device, comprising:

a main body defining a thickness direction, wherein at least one corner of the main body comprises two outer portions, an accommodation space is formed between the two outer portions along the thickness direction, and each of the two outer portions has an outer through hole; and at least one inner body, disposed in the accommodation space and located between the two outer portions, wherein the at least one inner body has an inner through hole, the two outer through holes and the inner through hole are connected to one another to form a through slot; and a strap body, comprising a holding portion and at least one strap portion, wherein an end of the at least one strap portion is connected to the holding portion, and another end of the at least one strap portion is disposed through the through slot;

wherein the accommodation space between the two outer portions is exposed at the at least one corner of the main body, allowing the at least one inner body to be mounted into the accommodation space along an inward direction or to be retracted from the accommodation space along an outward direction opposite to the inward direction, and wherein the inward direction and the outward direction are perpendicular to the thickness direction.

7. The portable electronic device assembly according to claim 6, wherein the main body comprises four corners, the portable electronic device comprises four inner bodies, each of the four corners comprises two said outer portions, the accommodation space is formed between the two said outer portions, the four inner bodies are disposed in the four accommodation spaces, respectively, the strap body comprises two strap portions, an end of each of the two said strap portions is connected to the holding portion, and the other end of each of the two said strap portions is disposed through a corresponding through slot, and the two corresponding through slots are located at diagonal two of the four corners, respectively.

8. The portable electronic device assembly according to claim 6, wherein the main body comprises four corners, the portable electronic device comprises four inner bodies, each of the four corners comprises two said outer portions, the accommodation space is formed between the two said outer portions, the four inner bodies are disposed in the four accommodation spaces, respectively, the strap body comprises four strap portions, an end of each of the four said strap portions is connected to the holding portion, and other ends of the four strap portions are disposed through the four through slots, respectively.

9. The portable electronic device assembly according to claim 6, wherein the portable electronic device comprises at least one fastener, the at least one corner of the main body has a first fastening hole, the at least one inner body has a second fastening hole, the first fastening hole corresponds to the second fastening hole, and the at least one fastener is fastened into the first fastening hole and the second fastening hole to fix the at least one inner body to the at least one corner of the main body.

10. The portable electronic device assembly according to claim 6, wherein a thickness of the at least one inner body along the thickness direction is greater than a thickness of one of the two outer portions along the thickness direction.

11. The portable electronic device assembly according to claim 10, wherein the thickness of the at least one inner body along the thickness direction is greater than two times of the thickness of one of the two outer portions along the thickness direction.

12. The portable electronic device assembly according to claim 6, wherein a hardness of the at least one inner body is greater than a hardness of the main body.

* * * * *